United States Patent [19]

Ogi et al.

[11] Patent Number: 5,605,723
[45] Date of Patent: Feb. 25, 1997

[54] METHOD FOR FORMING A PATTERN OF NON-VOLATILE FERROELECTRIC THIN FILM MEMORY

[75] Inventors: Katsumi Ogi; Tsutomu Atsuki; Hiroto Uchida; Tadashi Yonezawa; Nobuyuki Soyama, all of Omiya, Japan

[73] Assignee: Mitsubishi Materials Corporation, Tokyo, Japan

[21] Appl. No.: 434,312

[22] Filed: May 2, 1995

[30] Foreign Application Priority Data

May 16, 1994 [JP] Japan .................................. 6-100931

[51] Int. Cl.$^6$ .............................. B05D 3/06; B05D 3/02; H05H 1/00; C23C 18/00
[52] U.S. Cl. ...................... 427/533; 427/552; 427/555; 427/581; 427/126.3; 427/226
[58] Field of Search ................................... 427/533, 552, 427/556, 553, 581, 226, 126.3, 555

[56] References Cited

U.S. PATENT DOCUMENTS

| | | | |
|---|---|---|---|
| 4,963,390 | 10/1990 | Lipeles et al. | 427/100 |
| 5,116,643 | 5/1992 | Miller et al. | 427/266 |
| 5,156,884 | 10/1992 | Tanitsu et al. | 427/226 |
| 5,198,269 | 3/1993 | Swartz et al. | 427/226 |
| 5,217,754 | 6/1993 | Santiago-Aviles et al. | 427/226 |
| 5,238,877 | 8/1993 | Russell | 427/126.3 |
| 5,271,955 | 12/1993 | Maniar | 427/126.3 |
| 5,304,456 | 4/1994 | Ueda et al. | 430/270 |
| 5,326,721 | 7/1994 | Summerfeld | 427/126.3 |
| 5,348,775 | 9/1994 | Lin | 427/555 |
| 5,372,859 | 12/1994 | Thakoor | 427/554 |
| 5,391,393 | 2/1995 | Maniar | 427/126.3 |
| 5,478,610 | 12/1995 | Desu et al. | 427/126.3 |

Primary Examiner—Marianne Padgett
Attorney, Agent, or Firm—Ronald J. Kubovcik

[57] ABSTRACT

A pattern of a non-volatile high-performance ferroelectric thin film memory is formed by applying a composition containing hydrolytic metal compounds, and a photosensitizer which generates water when irradiated with active rays onto a substrate. The resultant film is exposed to active rays in compliance with a prescribed pattern to form an image and developed with a solvent to remove non-exposed portions, and then the remaining exposed portions are subjected to a heat treatment to convert the exposed portions into a dielectric substance comprising a metal oxide as expressed by the following formula (I):

$$(Bi_2O_2)^{2+}(A_{m-1}B_mO_{3m+1})^{2-} \qquad (I)$$

where A is one or more elements selected from the group consisting of Ba, Sr, Pb and Bi; B is one or more elements selected from the group consisting of Ti, Nb and Ta; and m is an integer of from 2 to 5.

19 Claims, 2 Drawing Sheets

METHOD FOR FORMING A PATTERN OF NON-VOLATILE FERROELECTRIC THIN FILM MEMORY

BACKGROUND OF THE INVENTION

1. Field of the Invention

The present invention relates to a method for easily and efficiently forming a pattern of a non-volatile, high-performance ferroelectric thin film memory.

2. Description of the Prior Art

As a conventional method for patterning a ferroelectric film, a dry etching technique (Japanese Patent Provisional Publication No. 5-175,174) is available. This method comprises first forming a ferroelectric film on a substrate, forming an inorganic film thereon, forming an organic resist film by ordinary photolithography, then subjecting the thus formed resist film to exposure and development to form a resist mask, forming a mask pattern comprising an inorganic film by removing portions of the inorganic film by reactive ion etching, then removing the resist mask through an ashing treatment with an oxygen plasma, etching the metal film by dry etching with a halogen gas, and finally removing, as required, the mask pattern of the remaining inorganic film.

A method has also been proposed which comprises generating an acid by light irradiation with the use of an acid generating agent such as a sulfonic ester in a sol-gel solution of a ferroelectric substance and patterning a film of the solution using a polycondensation reaction (Japanese Patent Provisional Publication No. 5-116,454).

Of the conventional methods described above, the method based on dry etching has problems in that many steps including application of a resist, ion implantation and etching result in a high cost and it is difficult to handle the strong acid used for etching.

In the method using an acid generating agent, on the other hand, which permits patterning using a simple process, when using a sulfur-containing compound such as a sulfonic ester as an acid generating agent, sulfur from the acid generating agent remains in the resultant ferroelectric film and impairs the properties of the produced memory. The method using an acid generating agent in which the generated acid accelerates a polycondensation reaction, is defective in that the polycondensation reaction is lower with respect to reaction rate as compared with a hydrolysis reaction. This leads to low reaction efficiency.

The present invention has as an object, solving of the above-mentioned problems of the conventional methods and providing of a method for easily and efficiently forming a pattern of a nonvolatile, high-performance ferroelectric thin film memory.

SUMMARY OF THE INVENTION

The present invention provides a method for forming a pattern of a non-volatile ferroelectric thin film memory of a dielectric substance having the following formula (I) on a substrate, which comprises the steps of applying a composition containing at least a hydrolytic metal compound and a photosensitizer which generates water when irradiated with active rays onto the substrate, exposing the resultant film to active rays according to a prescribed pattern to form an image, developing the film with a solvent to remove nonexposed portions, and then subjecting the film to a heat treatment to convert the exposed portions to a dielectric substance comprising a metal oxide, thereby forming a pattern:

$$(Bi_2O_2)^{2+}(A_{m-1}B_mO_{3m+1})^{2-} \quad (I)$$

(where A is one or more elements selected from the group consisting of Ba, Sr, Pb and Bi; B is one or more elements selected from the group consisting of Ti, Nb and Ta; and m is an integer of from 2 to 5).

DETAILED DESCRIPTION

The present invention is described below in detail in conjunction with the drawings.

FIGS. 1(a) to 1(e) are sectional views illustrating an embodiment of the method for forming a pattern of a non-volatile ferroelectric thin film memory as recited in the claims.

Figure 1A:
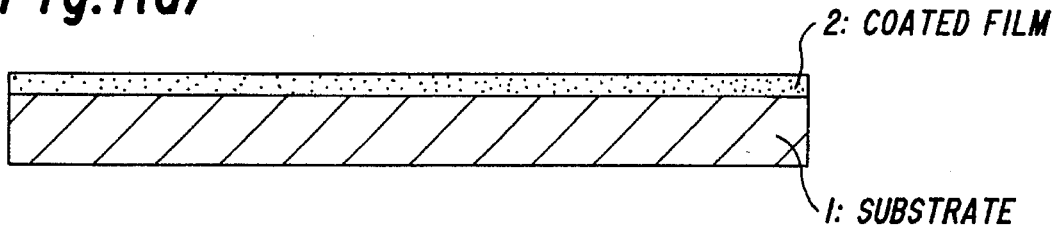
FIGS. 1(a), 1(b), 1(c), 1(d) and 1(e) are sectional views illustrating an embodiment of the method of the present invention for forming a pattern of a non-volatile ferroelectric thin film memory.

In the embodiment shown in FIGS. 1(a) to 1(e), a composition (hereinafter referred to as the "photosensitive coating solution") containing a hydrolytic metal compound and a photosensitizer (hereinafter referred to as the "water generating agent") which generates water when irradiated with active rays, is applied onto a substrate 1 (such as a Pt/Ti/SiO$_2$/Si substrate, a Pt/IrO/Ir/SiO$_2$/Si substrate, a Pt/TiN/SiO$_2$/Si substrate, a Pt/Ta/SiO$_2$/Si substrate, or a Pt/Ir/SiO$_2$/Si substrate) to form a photosensitive film 2 as shown in FIG. 1(a).

The hydrolytic metal compound contained in the photosensitive solution useful in the present invention includes hydrolytic organometallic compounds and metal halides capable of forming a metal oxide of formula (I) through baking of the resultant film.

There is no particular limitation as to hydrolytic organometallic compound in so far as a metal hydroxide can be formed through hydrolysis. Typical examples include metal alkoxides, metal acetylacetonate complexes and metal carboxylates. Preferable metal alkoxides include lower alkoxides such as ethoxides, propoxides, isopropoxides, butoxides or isobutoxides. Similarly, preferable metal carboxylates include metal compounds of a lower fatty acid such as acetates or propionates.

As the metal halides, chlorides or fluorides can be used.

Several kinds of hydrolytic metal compounds are used at prescribed ratios in accordance with the metal element composition of the produced metal oxides.

One or more compounds selected from the group consisting of o-nitrobenzyl alcohol, 1-hydroxymethyl-2-nitronaphthalene, 2-nitroethanol, formaldehyde, tartaric acid, 2-hydroxybenzyl alcohol, 2-carboxybenzyl alcohol, 2-carboxybenzaldehyde, 2-nitrobenzaldehyde and phthalic acid is used specifically as the water generating agent which generates water to cause the hydrolytic reaction of the hydrolytic metal compounds.

These water generating agents, when irradiated with active rays, undergo a dehydration reaction to generate water.

In the present invention, a photosensitizer which frees acid when irradiated with active rays (hereinafter referred to as an "acid generating agent") can be used together with the water generating agent, with a view to further accelerating the hydrolysis reaction of the hydrolytic metal compound. In the presence of the acid generating agent, acid generated by the irradiation of the active rays on the exposed portion acts as a catalyst to promote hardening of the hydrolytic metal compound. This effect further increases the difference in solubility between the exposed and the non-exposed portions and further reduces the required amount of irradiation.

As an acid generating agent capable of being used simultaneously with the water generating agent in the present invention, any of those compounds conventionally known in the area of photoresists and not containing sulfur, can be used. Useful acid generating agents include: onium salts such as iodonium salt; organic halides such as halogen-containing benzene derivatives, halogen-substituted alkanes and cycloalkanes, halogen-containing s-triazine or isocyanurate derivatives, and o- or p-nitrobenzylesters.

One or more kinds of both the water generating agent and the acid generating agent can be used.

The photosensitive coating solution used in the present invention can be prepared by dissolving a raw material hydrolytic metal compound in an appropriate organic solvent (e.g., ethanol, isopropanol, 2-methoxyethanol, 2-butanol and other alcohols; acetic acid, propionic acid and other lower aliphatic carboxylic acids), adding a water generating agent (or a water generating agent and an acid generating agent) to the resultant solution, and causing dissolution thereof.

The concentration of the hydrolytic metal compound in the photosensitive coating solution should preferably be within a range of from 1 to 20 wt. % as converted into metal oxides. The quantity of added water generating agent should be within a range of from 0.001 to 20 wt. %, or more preferably, from 0.1 to 10 wt. %. The concentration of the acid generating agent should be up to 20 wt. %, preferably within a range of from 0.001 to 20 wt %, or more preferably, from 0.1 to 10 wt. %. The total of the quantities of the water generating agent and the acid generating agent should preferably be up to 20 wt. %.

A quantity of added water generating agent smaller than the prescribed range will not bring about a large difference in solubility between the exposed and the non-exposed portions, thus making it impossible to form a clear pattern. With a quantity of added water generating agent larger than the prescribed range, irradiation causes denaturation of the coated film, including the non-exposed portion, thus making it also impossible to form a clear pattern.

A chelating compound such as acetylacetone, ethanolamine and ethyl oxo-butanoic acid can be added to the coating solution as a stabilizing agent to prevent gelation during storage. The chelating compound can be added in an amount of from 0.05 to 10 mol relative to 1 mol of the hydrolytic metal compound.

While there is no particular limitation concerning the method for applying the photosensitive solution to the substrate so far as it permits formation of a film having a uniform thickness, a spincoat method is commonly adopted for industrial purposes. As required, a desired film thickness can be obtained by repeating the application operation after gelation of the film. It is possible to provide an increased film thickness using the photosensitive coating solution of the present invention, because irradiation is possible with a smaller amount of energy through addition of the water generating agent.

The resultant film loses its fluidity after a short period of time, and permits exposure. The holding time can be set so as to dry the film (i.e., so as to cause the film to lose its fluidity) to the extent of permitting irradiation with active rays for forming an image, and is usually within a range of from several seconds to several minutes.

Figure 1B:
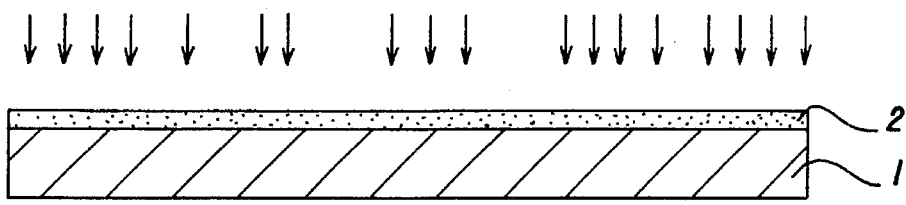

Then, the film is exposed for image formation by irradiation with active rays to form an image corresponding to a desired memory pattern (FIG. 1(b)). Applicable active rays, which vary with the adopted photosensitizer (water generating agent and acid generating agent), generally include ultraviolet rays, an electron beam, an ion beam and X-rays. The source of ultraviolet rays can be, for example, a low-voltage mercury lamp, or an excimer laser. The image forming exposure can be conducted by irradiating the active rays through a mask by a conventional method or, when the active-ray source is a laser, by a direct drawing method consisting of irradiating with a patterned laser beam. The amount of energy of irradiation is not specifically limited. An amount of at least 100 mJ/cm$^2$ is typically sufficient but varies, however, with the film thickness and the kind of the photosensitizer.

Figure 1C:
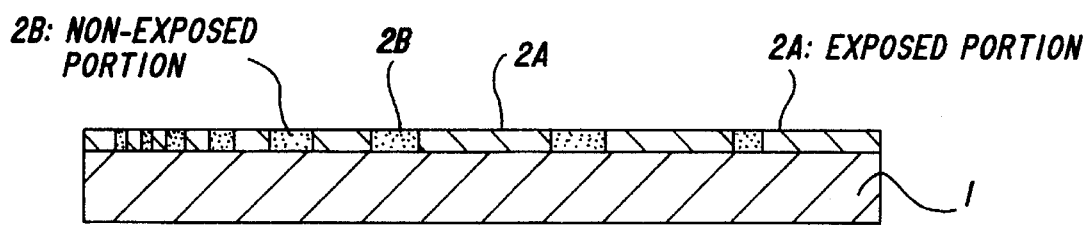

As a result of irradiation with the active rays, the hardening reaction, the hydrolysis reaction and the polymerization reaction of the above-mentioned coated film proceed in the exposed portion (2A in FIG. 1(c)), and the coated film becomes harder and denser and the solubility thereof in a solvent (such as an alcohol) decreases. In the present invention in which a water generating agent is present, the hardening reaction of the exposed portion can be selectively promoted with a smaller amount of irradiation energy of active rays. The objective of the irradiation can sufficiently be achieved, not only with rays having a very high energy density such as electron beams, but also with ultraviolet rays having a lower energy density. In the simultaneous presence of the acid generating agent in the film, acid generated in the exposed portion further accelerates the hardening reaction of the film.

As required, the film can be held, after irradiation of the active rays as described above, in a dried inert gas atmosphere (such as nitrogen or argon) at 40° to 100° C. for one to ten minutes. By maintaining the temperature while shutting the film off from moisture in the air, it is possible to further promote selectively the hardening reaction of the exposed portion of the film, thus further increasing the difference in solubility between the exposed and the non-exposed portions (2B in FIG. 1(c)).

After irradiation, the film can be dried, as required, by fully heating the substrate. This eliminates moisture and organic solvent remaining in the exposed portion which forms the target pattern. It is sufficient to perform this full heating, for example, at 100° to 150° C. for about five to ten minutes.

Figure 1D:
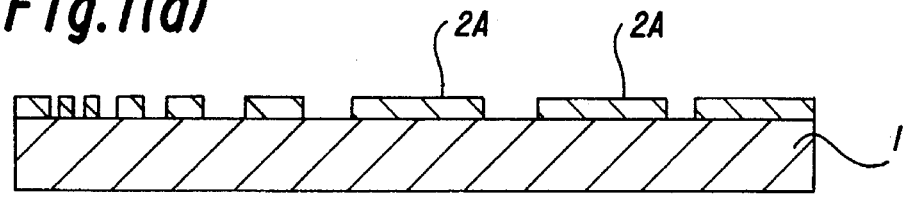
Figure 1E:
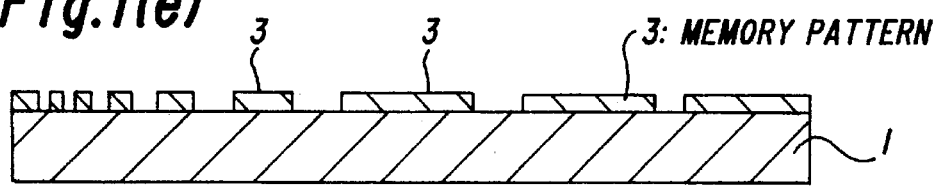

Thereafter, a pattern comprising the exposed portion 2A is formed on the substrate by removing the non-hardened film portion (non-exposed portion 2B) through development by means of an appropriate solvent (FIG. 1(d)). Any solvent which can dissolve the material of the non-exposed portion and has a small solubility for the hardened film of the exposed portion can be used as the developing agent.

Usually, use of water or an alcohol is preferable. Suitable alcohols include alkoxyalcohols such as 2-methoxyethanol and 2-ethoxyethanol. When this type of alcohol is so high in solvent power as to cause dissolution of the exposed portion, solubility can be adjusted by adding an alkyl alcohol such as ethyl alcohol or isopropyl alcohol (IPA). It is not necessary, therefore, to use a strong corrosive acid such as a mixed fluoric/hydrochloric acid for development, and the possibility of developing the film with a safe and inexpensive solvent (such as an alcohol) without corrosive action is one of the important advantages of the present invention.

The developing step can be conducted, for example, by immersing the film in the solvent at room temperature for about ten seconds to ten minutes. Conditions are set so that the non-exposed portion is completely eliminated and the exposed portion is not substantially removed. The development conditions vary, therefore, with the amount of irradiated active rays, use of a heat treatment step, and the kind of solvent used for development.

To prevent dissolution of the film in excess of that necessary to remove the non-exposed portion in the development step, it is desirable to perform rinsing with an appropriate organic solvent having no or only a very slight solubility for the film in the exposed portion. For example, esters (e.g., ethyl acetate), ketones (e.g., methyl ethyl ketone, methyl isobutyl ketone), and hydrocarbons (e.g., toluene, n-hexane) are useful as the rinsing agent. An alcohol having a relatively low polarity such as isopropyl alcohol can also be used as the rinsing agent.

A memory pattern comprising the remaining exposed portion is formed on the substrate 1. Thereafter, a ferroelectric thin film memory pattern 3 comprising a desired metal oxide is prepared by converting the metal compounds in the film fully into metal oxides through a heat treatment of the substrate (FIG. 1(e)). This heat treatment should preferably be carried out through baking in open air or in an oxygen atmosphere at 300° to 800° C. for one second to two hours. The thin-film memory pattern should preferably have a thickness within a range of from 0.01 to 1 μm after the heat treatment.

The hydrolytic metal compound in the photosensitive coating solution of the present invention is hydrolyzed through reaction with water, and then converted into a gel via a sol state of a water-containing metal oxide, and as the reaction proceeds further, the film is hardened by a polymerization reaction in which metal-oxygen bonding results in three-dimensional crosslinking. This photosensitive coating solution contains a water generating agent which generates water when irradiated with active rays. Water is generated from the water generating agent upon irradiation with the active rays, thus accelerating the hydrolysis reaction of the hydrolytic metal compound. Consequently, the hardening reaction of the film considerably proceeds, and the difference in solubility between the exposed and non-exposed portions becomes very large.

After exposing a coated film of this photosensitive coating solution to form an image, the non-exposed portion is removed by bringing the same into contact with a solvent. As a result of the subsequent heat treatment, the product at the exposed portion remains as a ferroelectric thin-film memory of the patterned metal oxides.

The present invention is described below in further detail by means of examples and comparative examples.

Example 1

Patterning of $SrBi_2Nb_2O_9$ was conducted in accordance with the method shown in FIG. 1.

First, a coated film was formed by applying a photosensitive coating solution having a composition as shown in Table 1 onto a Pt/Ti/SiO$_2$/Si substrate by a spin coat method at a revolution of 2,000 rpm for 15 seconds (FIG. 1(a)).

This photosensitive coating solution was prepared as follows. Bismuth acetate ($Bi(CH_3COO)_3$), strontium isopropoxide ($Sr(i-OC_3H_7)_2$) and niobium ethoxide ($Nb(OC_2H_5)_5$) were mixed with 2-methyoxyethanol and the mixture was refluxed. Then, the weight was adjusted with 2-methoxyethanol so as to obtain 100 g of a solution containing 5 wt. % $SrBi_2Nb_2O_9$ as converted into oxide. Nitrobenzyl alcohol in an amount of 0.5 g as a water generating agent was added to the solution, to complete the photosensitive coating solution. The quantities of the added raw materials as a whole were as shown in Table 1.

After holding the coated film at room temperature for a minute, far-ultraviolet rays from a low-voltage mercury lamp as a light source (significant wavelength: 254 nm) were irradiated at a rate of about 100 mJ/cm$^2$ onto the coated film through a circuit pattern. After irradiation of the far-ultraviolet rays, the substrate was heated and dried in open air at 100° C. for a minute. Then, the substrate was immersed in an etching liquid [2-methoxyethanol:isopropyl alcohol=1:1 (in vol.) mixed solution] for a minute to remove the non-exposed portion by dissolution. Then, the substrate was immersed in IPA (isopropyl alcohol), a rinsing liquid, at room temperature for five seconds. Subsequently, the substrate was baked in open air at 400° C. for five minutes and then at 500° C. for ten minutes, thereby giving a memory pattern having a film thickness of 1,500 Å and comprising $SrBi_2Nb_2O_9$.

Figure 2:
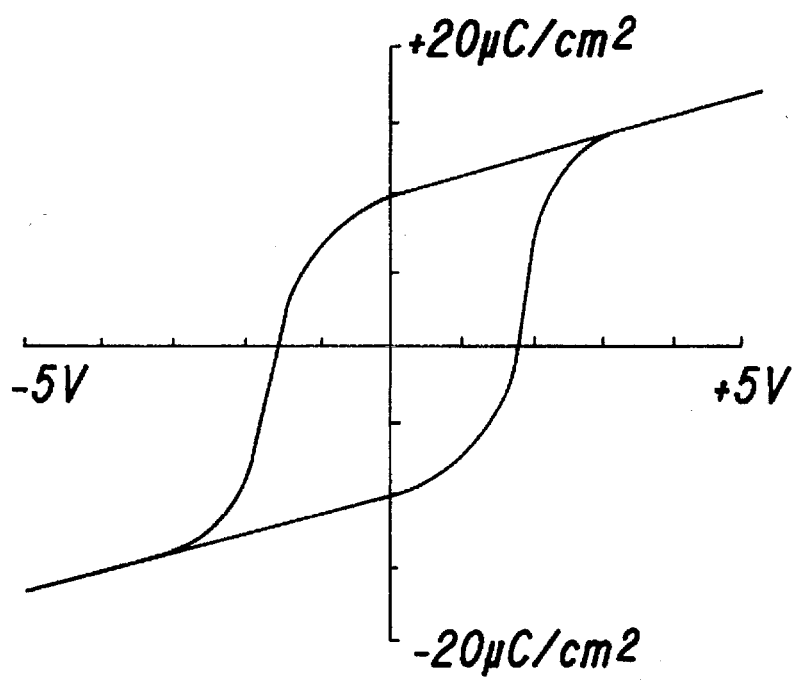
FIG. 2 is a graph illustrating a hysteresis curve of the ferroelectric thin film memory obtained in Example 1.

The hysteresis curve when a voltage of 5 V was applied onto the resultant ferroelectric thin film memory is shown in FIG. 2, suggesting a satisfactory residual polarization.

Comparative Example 1

Another ferroelectric thin film memory was formed in the same manner as in Example 1 except that sulfonic ester as an acid generating agent in an amount of 0.5 g was added in place of nitrobenzyl alcohol.

Figure 3:
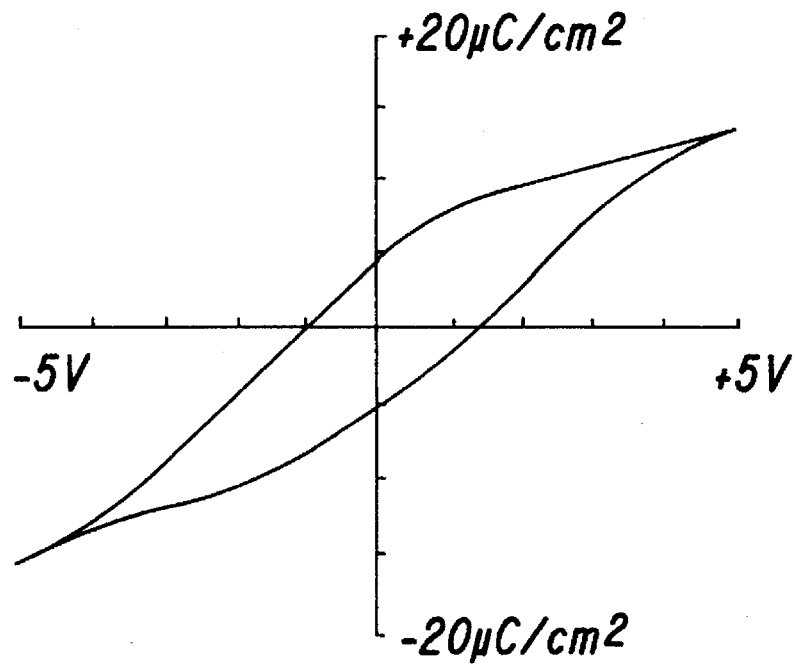
FIG. 3 is a graph illustrating a hysteresis curve of the ferroelectric thin film memory obtained in Comparative Example 1.

The hysteresis curve when a voltage of 5 V was applied onto the resultant ferroelectric thin film memory is as shown in FIG. 3, suggesting that residual polarization is reduced as compared with that in Example 1.

Analysis of this ferroelectric thin film permitted confirmation of residual sulfur.

Examples 2 to 16

Ferroelectric thin-film memories having film thicknesses and compositions as shown in Tables 1 to 3 were formed in the same manner as in Example 1 except that photosensitive coating solutions having the blending ratios shown in Tables 1 to 3 were employed. All the resultant ferroelectric thin-film memories demonstrated a satisfactory residual polarization.

TABLE 1

| | Blending of Photosensitive Coating Solution | | | | | Ferroelectric Thin Film | |
|---|---|---|---|---|---|---|---|
| | Hydrolytic Metal Compound | | Water Generating Agent | | Solvent | | |
| | Kind | Qty. of addition (g) | Kind | Qty. of addition (g) | Qty. of addition (g) | Composition | Film Thickness (Å) |
| 1 | $Bi(CH_3COO)_3$ $Sr(i-OC_3H_7)_2$ $Nb(OC_2H_5)_5$ | 4.63 1.23 3.82 | Nitro- benzyl alcohol | 0.5 | 95 | $SrBi_2Nb_2O_9$ | 1500 |
| 2 | $Bi(CH_3COO)_3$ $Sr(i-OC_3H_7)_2$ $Ta(OC_2H_5)_5$ | 3.82 1.02 4.02 | Nitrobenz -aldehyde | 0.5 | 95 | $SrBi_2Ta_2O_9$ | 1500 |
| 3 | $Bi(CH_3COO)_3$ $Ba(i-OC_3H_7)_2$ $Nb(OC_2H_5)_5$ | 4.37 1.45 3.60 | Nitro- benzyl alcohol | 0.5 | 95 | $BaBi_2Nb_2O_9$ | 1500 |
| 4 | $Bi(CH_3COO)_3$ $Ba(i-OC_3H_7)_2$ $Ta(OC_2H_5)_5$ | 3.65 1.21 3.84 | Nitrobenz -aldehyde | 0.5 | 95 | $BaBi_2Ta_2O_9$ | 1500 |
| 5 | $Bi(CH_3COO)_3$ $Pb(CH_3COO)_2 \cdot 3H_2O$ $Nb(OC_2H_5)_5$ | 4.05 1.99 3.34 | Form- aldehyde | 0.5 | 95 | $PbBi_2Nb_2O_9$ | 1500 |
| 6 | $Bi(CH_3COO)_3$ $Pb(CH_3COO)_2 \cdot 3H_2O$ $Ta(OC_2H_5)_5$ | 3.42 1.68 3.60 | Hydroxy- benzyl alcohol | 0.5 | 95 | $PbBi_2Ta_2O_9$ | 1500 |

TABLE 2

| | Blending of Photosensitive Coating Solution | | | | | Ferroelectric Thin Film | |
|---|---|---|---|---|---|---|---|
| | Hydrolytic Metal Compound | | Water Generating Agent | | Solvent | | |
| | Kind | Qty. of addition (g) | Kind | Qty. of addition (g) | Qty. of addition (g) | Composition | Film Thickness (Å) |
| 7 | $Bi(CH_3COO)_3$ $Ba(i-OC_3H_7)_2$ $Nb(OC_2H_5)_5$ | 4.37 1.45 3.60 | Form- aldehyde | 1 | 95 | $BaBi_2Nb_2O_9$ | 1500 |
| 8 | $Bi(CH_3COO)_3$ $Ba(i-OC_3H_7)_2$ $Ta(OC_2H_5)_5$ | 3.65 1.21 3.84 | o-Nitro- benzyl alcohol | 0.5 | 95 | $BaBi_2Ta_2O_9$ | 1500 |
| 9 | $Bi(CH_3COO)_3$ $Ba(i-OC_3H_7)_2$ $Ti(i-OC_3H_7)_4$ | 5.51 0.91 4.06 | 2-nitro- ethanol | 1 | 95 | $BaBi_4Ti_4O_{15}$ | 1500 |
| 10 | $Bi(CH_3COO)_3$ $Ba(i-OC_3H_7)_2$ $Ti(i-OC_3H_7)_4$ | 4.73 1.56 4.35 | 2-nitro- benzyl aldehyde | 0.5 | 95 | $Ba_2Bi_2Ti_5O_{18}$ | 1500 |
| 11 | $Bi(CH_3COO)_3$ $Ba(i-OC_3H_7)_2$ $Ta(OC_2H_5)_5$ $Nb(OC_2H_5)_5$ | 4.00 1.32 2.10 1.64 | o-nitro- benzyl alcohol | 0.5 | 95 | $BaBi_2NbTaO_9$ | 1500 |

TABLE 3

| | Blending of Photosensitive Coating Solution | | | | | Ferroelectric Thin Film | |
|---|---|---|---|---|---|---|---|
| | Hydrolytic Metal Compound | | Water Generating Agent | | Solvent | | |
| | Kind | Qty. of addition (g) | Kind | Qty. of addition (g) | Qty. of addition (g) | Composition | Film Thickness (Å) |
| 12 | $Bi(CH_3COO)_3$ $Pb(CH_3COO)_2 \cdot 3H_2O$ $Nb(OC_2H_5)_5$ | 4.05 1.99 3.34 | 2-nitro- benzyl aldehyde | 0.5 | 95 | $PbBi_2Nb_2O_9$ | 1400 |
| 13 | $Bi(CH_3COO)_3$ $Pb(CH_3COO)_2 \cdot 3H_2O$ $Ta(OC_2H_5)_5$ | 3.42 1.68 3.60 | 2-carboxy- benzyl alcohol | 1 | 95 | $PbBi_2Ta_2O_9$ | 1400 |

TABLE 3-continued

| | Blending of Photosensitive Coating Solution | | | | | Ferroelectric Thin Film | |
|---|---|---|---|---|---|---|---|
| | Hydrolytic Metal Compound | | Water Generating Agent | | Solvent | | |
| | Kind | Qty. of addition (g) | Kind | Qty. of addition (g) | Qty. of addition (g) | Composition | Film Thickness (Å) |
| 14 | Bi(CH₃COO)₃ Pb(CH₃COO)₂.3H₂O Ti(i-OC₃H₇)₄ | 5.25 1.29 3.87 | 2-carboxy-benz aldehyde | 1 | 95 | PbBi₄Ti₄O₁₅ | 1400 |
| 15 | Bi(CH₃COO)₃ Pb(CH₃COO)₂.3H₂O Ti(i-OC₃H₇)₄ | 4.35 2.14 4.01 | 2-nitro-benz aldehyde | 0.5 | 95 | Pb₂Bi₄Ti₅O₁₈ | 1400 |
| 16 | Bi(CH₃COO)₃ Pb(CH₃COO)₂.3H₂O Ta(OC₂H₅)₅ Nb(OC₂H₅)₅ | 3.71 1.82 1.95 1.53 | 2-hydroxy-benzyl alcohol | 0.5 | 95 | PbBi₂NbTaO₉ | 1400 |

According to the method for forming a pattern of a non-volatile ferroelectric thin film memory of the present invention, as described above in detail, it is possible to easily and efficiently form a high-performance, non-volatile ferroelectric thin film memory at high productivity.

What is claimed is:

1. A method for forming a prescribed pattern of a non-volatile ferroelectric thin film memory comprised of a dielectric substance of a metal oxide of formula (I) on a substrate,

$$(Bi_2O_2)^{2+}(A_{m-1}B_mO_{3m+1})^{2-} \quad (I)$$

where X is one or more elements selected from the group consisting of Ba, Sr, Pb and Bi; Y is one or more elements selected from the group consisting of Ti, Nb and Ta; and m is an integer of from 2 to 5, the method comprising the steps of:
applying onto the substrate a solution comprising a hydrolytic metal compound which forms the metal oxide of formula (I) through a hydrolysate, a water generating agent which generates water when irradiated with active rays and an organic solvent to form a film; exposing the film through the prescribed pattern to active rays of sufficient energy to cause said water generating agent to generate water and to hydrolyze said hydrolytic metal compound to said hydrolysate and to form an image having the prescribed pattern; developing said image by solvating non-exposed portions of the film; and then subjecting said image to a heat treatment to convert the hydrolysate into the metal oxide of formula (I), thereby forming the prescribed pattern of the non-volatile ferroelectric thin film memory.

2. The method of claim 1, wherein the hydrolytic metal compound is a metal alkoxide, a metal acetylacetonate complex, a metal carboxylate or a metal halide.

3. The method of claim 2, wherein the hydrolytic metal compound is the metal alkoxide which is a metal ethoxide, a metal propoxide, a metal isopropoxide or a metal isobutoxide.

4. The method of claim 2, wherein the hydrolytic metal compound is the metal carboxylate which is a metal acetate or a metal propionate.

5. The method of claim 2, wherein the hydrolytic metal compound is the metal halide which is a metal chloride or fluoride.

6. The method of claim 1, wherein the water generating agent is selected from the group consisting of o-nitrobenzyl alcohol, 1-hydroxymethyl-2-nitronaphthalene, 2-nitroethanol, formaldehyde, tartaric acid, 2-hydroxybenzyl alcohol, 2-carboxybenzylalcohol, 2-carboxybenzaldehyde, 2-nitrobenzaldehyde and phthalic acid.

7. The method of claim 1, wherein the solution also contains an acid generating agent which generates an acid when irradiated with active rays.

8. The method of claim 7, wherein the acid generating agent is an iodonium salt, a halogen-containing benzene derivative, a halogen-substituted alkane or cycloalkane, a halogen-containing s-triazine or isocyanurate derivative, or o- or p-nitro benzylester.

9. The method of claim 1, wherein the concentration of the hydrolytic metal compound in the solution is 1 to 20 wt. % as converted to a metal oxide.

10. The method of claim 9, wherein the concentration of the water generating agent in the solution is 0.001 to 20 wt. %.

11. The method of claim 7, wherein the concentration of the acid generating agent in the solution is 0.001 to 20 wt. %.

12. The method of claim 1, wherein the solution also contains a chelating compound in an amount of from 0.05 to 10 mol relative to 1 mol of the hydrolytic metal compound.

13. The method of claim 1, wherein the solution is applied to the substrate by spin-coating.

14. The method of claim 1, wherein the substrate is a Pt/Ti/SiO₂/Si substrate, a Pt/IrO/Ir/SiO₂/Si substrate, a Pt/TiN/SiO₂/Si substrate, a Pt/Ta/SiO₂/Si substrate, or a Pt/Ir/SiO₂/Si substrate.

15. The method of claim 1, wherein the active rays are selected from the group consisting of ultraviolet rays, an electron beam, an ion beam and X-rays.

16. The method of claim 15, wherein the energy of irradiation is at least 100 mJ/cm².

17. The method of claim 1, wherein after irradiation and prior to developing, the image is held in a dried inert gas at 40°–100° C. for from 1 to 10 minutes.

18. The method of claim 1, wherein the solvent used to solvate the non-exposed portion of the film is an alkoxyalcohol.

19. The method of claim 1, wherein said heat treatment is carried out through baking in open air or in an oxygen atmosphere at 300°–800° C. for 1 second to two hours.

* * * * *